(12) United States Patent
Huang

(10) Patent No.: US 9,390,959 B2
(45) Date of Patent: Jul. 12, 2016

(54) SEMICONDUCTOR PACKAGE WITH STATOR SET FORMED BY CIRCUITS

(71) Applicant: Amtek Semiconductors Co., Ltd., New Taipei (TW)

(72) Inventor: Chien-Ping Huang, New Taipei (TW)

(73) Assignee: Amtek Semiconductors Co., Ltd., New Taipei (TW)

(*) Notice: Subject to any disclaimer, the term of this patent is extended or adjusted under 35 U.S.C. 154(b) by 0 days.

(21) Appl. No.: 13/860,796

(22) Filed: Apr. 11, 2013

(65) Prior Publication Data

US 2014/0203450 A1 Jul. 24, 2014

(30) Foreign Application Priority Data

Jan. 23, 2013 (TW) ............................. 102102421 A

(51) Int. Cl.
| | |
|---|---|
| *H01L 23/52* | (2006.01) |
| *H01L 21/71* | (2006.01) |
| *H01L 23/467* | (2006.01) |
| *H05K 1/02* | (2006.01) |
| *H05K 1/16* | (2006.01) |
| *H01L 23/31* | (2006.01) |
| *H05K 3/28* | (2006.01) |

(52) U.S. Cl.
CPC .............. *H01L 21/71* (2013.01); *H01L 23/467* (2013.01); *H05K 1/0209* (2013.01); *H05K 1/165* (2013.01); *H01L 23/3121* (2013.01); *H01L 2224/48091* (2013.01); *H01L 2224/48227* (2013.01); *H05K 1/0272* (2013.01); *H05K 3/284* (2013.01); *H05K 2201/09063* (2013.01); *H05K 2201/1009* (2013.01)

(58) Field of Classification Search
CPC ...... H01L 23/433; H01L 21/71; H01L 23/467; H01L 23/3121; H01L 2224/48227; H01L 2224/48091; H05K 1/165; H05K 1/0209; H05K 2201/09063; H05K 1/0272; H05K 3/284; H05K 2201/1009
USPC .......................................... 257/774; 438/124
See application file for complete search history.

(56) References Cited

U.S. PATENT DOCUMENTS

| | | | |
|---|---|---|---|
| 6,799,282 B2 | 9/2004 | Maeda et al. | |
| 7,215,548 B1 | 5/2007 | Wu et al. | |
| 7,286,357 B2 | 10/2007 | Wung et al. | |
| 7,345,884 B2 | 3/2008 | Horng et al. | |
| 7,568,517 B2 | 8/2009 | Hwang et al. | |
| 7,857,583 B2 * | 12/2010 | Horng et al. | 415/203 |

(Continued)

*Primary Examiner* — Phat X Cao
*Assistant Examiner* — Mohammad M Hoque
(74) *Attorney, Agent, or Firm* — Mintz Levin Cohn Ferris Glovsky and Popeo, P.C.; Peter F. Corless; Steven M. Jensen

(57) ABSTRACT

A semiconductor package is provided, including a substrate having a top surface, a bottom surface opposing the top surface, a via communicating the top surface with the bottom surface, and a stator set formed by circuits; an axial tube axially installed in the via of the substrate; a plurality of electronic components mounted on the top surface of the substrate and electrically connected to the substrate; an encapsulant formed on the top surface of the substrate for encapsulating the electronic components and the axial tube; and an impeller axially coupled to the axial tube via the bottom surface of the substrate. In the semiconductor package, the stator set is formed in the substrate by a patterning process. Therefore, the thickness of the semiconductor package is reduced significantly.

11 Claims, 8 Drawing Sheets

(56) References Cited

U.S. PATENT DOCUMENTS

| | | | |
|---|---|---|---|
| 8,342,799 B2* | 1/2013 | Hwang et al. | 415/185 |
| 8,488,320 B2* | 7/2013 | Tseng | 361/695 |
| 2004/0095878 A1* | 5/2004 | Hong | 369/266 |
| 2005/0123224 A1* | 6/2005 | Chen | 384/119 |
| 2005/0135715 A1* | 6/2005 | Chen | 384/119 |
| 2007/0098571 A1* | 5/2007 | Nagamatsu | 417/354 |
| 2007/0222331 A1* | 9/2007 | Horng et al. | 310/268 |
| 2008/0213104 A1* | 9/2008 | Chen et al. | 417/354 |
| 2008/0232961 A1* | 9/2008 | Lin et al. | 415/213.1 |
| 2008/0238228 A1* | 10/2008 | Chang et al. | 310/90 |
| 2009/0146516 A1* | 6/2009 | Yano et al. | 310/152 |
| 2009/0295254 A1* | 12/2009 | Horng et al. | 310/256 |
| 2010/0232957 A1* | 9/2010 | Horng | 415/208.1 |
| 2011/0292607 A1* | 12/2011 | Tseng | 361/695 |
| 2012/0201704 A1* | 8/2012 | Aoki et al. | 417/423.14 |
| 2013/0049185 A1* | 2/2013 | Tseng | 257/704 |

* cited by examiner

FIG. 2E"

SEMICONDUCTOR PACKAGE WITH STATOR SET FORMED BY CIRCUITS

CROSS-REFERENCES TO RELATED APPLICATIONS

This application claims under 35 U.S.C. §119(a) the benefit of Taiwanese Application No. 102102421, filed Jan. 23, 2013, the entire contents of which is incorporated herein by reference.

BACKGROUND OF THE INVENTION

1. Field of the Invention

This invention relates to semiconductor packages and methods of fabricating the same, and, more particularly, to a semiconductor package having a stator set formed by circuits and a method of fabricating the semiconductor package.

2. Description of Related Art

A circuit board, such as a main board or a mother board, has disposed thereon a plurality of electronic components, such as a central processing unit or a graphic card, and conductive circuits that are electrically connected to the electronic components. In operation, the electronic components generate heat. The electronic components will malfunction if the heat is not effectively dissipated to a region outside of an electronic product in which the circuit board is installed. The heat-dissipating capability plays a dominant role in modern electronic products that have various functions and operate at a high speed. The various functions and high operation speed mean that more and higher-leveled electronic components are integrated on the circuit board. As a result, more heat is generated by a modern electronic product, and how to dissipate the heat generated by the electronic components is becoming a serious issue in the art.

A heat-dissipating fan is installed on a main board or a mother board, to dissipate the heat generated by the electronic components and/or the electronic products. U.S. Pat. Nos. 6,799,282, 7,215,548, 7,286,357 and 7,568,517 disclose such a heat-dissipating fan.

A conventional heat-dissipating fan, as shown in FIG. 1A, is installed at a predetermined position on a circuit board, and comprises a printed circuit board 11, a housing 12 and an impeller 13. The housing 12 comprises a base 120, an axial tube 122, and a stator set 121 surrounding the axial tube 122. The impeller 13 comprises a hub 130, a magnet 131 installed on an inner side of the hub 130, a plurality of blades 132 surrounding an outer side of the hub 130, and a shaft 133 axially coupled to the hub 130 and axially installed in the axial tube 122. The printed circuit board 11 has at least one control chip 110 and a plurality of passive components 112 disposed thereon. The printed circuit board 11 is disposed on the base 120 of the housing 12. The control chip 110 controls the rotation of the impeller 13, and the rotating impeller 13 drives airflow.

The control chip 110 of the heat-dissipating fan shown in FIG. 1A is also a heat-generating source, and will malfunction if the heat cannot be dissipated effectively. Once the control chip 110 malfunctions, the heat generated by the electronic components installed on the main board of the electronic product cannot be dissipated effectively, and the electronic product is likely to operate abnormally or even be damaged. The control chip 110 is installed exactly in a gap between the base 120 of the housing 12 and the impeller 13. The gap is so small that the heat generated by the control chip 110 cannot be dissipated effectively. As a result, the control chip 110 is overheated and damaged eventually. Though being very cheap as compared to key components of the electronic product, the heat-dissipating fan, if malfunctioning, will affect the normal operation of the key components.

Besides, the installation of the control chip 110 affects the size of the gap between the hub 130 of the impeller 13 and the base 120 of the housing 12, and the thickness of the control chip 110 amounts to the height of the gap, which is adversely to the reduction of the overall height of the heat-dissipating fan. The control chip 110 occupies the precious area of the printed circuit board 11. If the printed circuit board 11 cannot be reduced any further, the blades 132 have to have their sizes reduced. However, the airflow of the blades 132 with reduced sizes is reduced accordingly. As a result, the heat-dissipating effect is greatly impacted.

In order to solve the above problem, U.S. Pat. No. 7,345,884 discloses an improved heat-dissipating fan. As shown in FIG. 1B, the heat-dissipating fan of U.S. Pat. No. 7,345,884 differs from the heat-dissipating fan shown in FIG. 1A in that a printed circuit board 11' of the heat-dissipating fan of U.S. Pat. No. 7,345,884 has an extension portion 11a extending externally for a control chip 110' to be disposed thereon, such that the control chip 110' is disposed in a gap between a base 120' of a housing 12' and a hub 130' of an impeller 13' or has a portion exposed from the gap. Therefore, the airflow driven by the impeller 13' can dissipate the heat generated by the control chip 110'.

However, the extension portion 11a of the printed circuit board 11' interferes the airflow generated by the impeller 13'. The airflow, if interfered, generates noises and affects the quality of an electronic product in which the heat-dissipating fan is installed. Besides, since the extension portion 11a extends externally, blades 132' have to be away from the control chip 110' at a predetermined interval, which is also adversely to the reduction of the overall height of the heat-dissipating fan. Therefore, the electronic product cannot meet the compact-size and low-profile requirements.

Moreover, since in the heat-dissipating fan the printed circuit board 11' still has to be installed between the hub 130' of the impeller 13' and the base 120' of the housing 12', the height of the heat-dissipating fan is thus affected by the thickness of the printed circuit board 11' and cannot be reduced any further.

SUMMARY OF THE INVENTION

The present invention provides a semiconductor package, comprising: a substrate having a top surface, a bottom surface opposing the top surface, a via communicating the top surface with the bottom surface, and a stator set formed by circuits; an axial tube axially installed in the via of the substrate; a plurality of electronic components mounted on the top surface of the substrate and electrically connected to the substrate; an encapsulant formed on the top surface of the substrate for encapsulating the electronic components and the axial tube; and an impeller axially coupled to the axial tube via the bottom surface of the substrate.

In order to obtain the semiconductor package, the present invention further provides a method of fabricating the semiconductor package, comprising: mounting a plurality of electronic components on a substrate having a stator set formed by circuits, a top surface, a bottom surface opposing the top surface, and a via communicating the top surface with the bottom surface, axially disposing an axial tube in the via, and forming an encapsulant on the top surface of the substrate for encapsulating the electronic components and the axial tube; cutting the substrate; and axially coupling an impeller to the axial tube via the bottom surface of the substrate.

In an embodiment, the substrate includes a core layer having a first surface and a second surface opposing the first surface, a first solder-resistant layer formed on the first surface and an exposed surface thereof corresponding to the top surface of the substrate, and a second solder-resistant layer formed on the second surface and an exposed surface thereof corresponding to the bottom surface of the substrate, wherein the stator set is formed on the first surface and the second surface of the core layer and is covered by the first solder-resistant layer and the second solder-resistant layer.

In an embodiment, the stator set includes a first spiral circuit formed on the first surface of the core layer and covered by the first solder-resistant layer, a second spiral circuit formed on the second surface of the core layer and covered by the second solder-resistant layer, and at least a conductive via penetrating the core layer of the substrate for electrically connecting the first spiral circuit to the second spiral circuit.

In another embodiment, the substrate is fabricated by forming spiral circuits that act as the stator set on the first surface and the second surface of the core layer; covering the first surface and the second surface of the core layer with a first solder-resistant layer and a second solder-resistant layer of the stator set, respectively; and forming a via communicating the top surface with the bottom surface, and installing the axial tube in the via. In an embodiment, the via is formed at a region away from a center of the semiconductor package.

In an embodiment, the core layer has the electronic component installed therein and encapsulated by the encapsulant.

In an embodiment, the method further comprises forming a circuit layer at a region on the first surface of the core layer where the stator set is not formed. In another embodiment, the method further comprises, prior to forming the encapsulant, forming a conductive element disposed in the encapsulant and electrically connected to the circuit layer of the substrate and having an end exposed from the encapsulant.

In yet another embodiment, the method further comprises forming on the conductive element an externally-connected component electrically connected to the conductive element.

In an embodiment, the method further comprises, prior to cutting the substrate, forming at least an air vent penetrating the top surface and the bottom surface of the substrate and the encapsulant, to form an axially air passage. Alternatively, the method further comprises, prior to cutting the substrate, disposing an outer cover on the substrate and surrounding the impeller, to form an axially flow inducing cover.

In yet another embodiment, the semiconductor package further comprises an inducing cover fixed to the encapsulant and a side surface of the substrate, to enhance the airflow and reduce noises. In an embodiment, the inducing cover is adhesively or mechanically fixed to the encapsulant and a side surface of the substrate, or is directly formed on the substrate by the encapsulant. In addition to having a top opening that provides axially flowing air, the inducing cover may be designed to have a first inducing opening parallel to the axial tube and a second inducing opening perpendicular to the axial tube, to provide a radial flowing air.

Since the stator set of the semiconductor package according to the present invention is a spiral circuit directly formed on the core layer of the substrate, the semiconductor package has an overall thickness reduced.

According to the present invention, the electronic component does not need to be installed between a base of the housing and a hub of the impeller. Therefore, heat generated by the electronic component can be dissipated effectively. Moreover, since the encapsulant has a thickness that is controllable, the package in which the impeller is installed has a thickness reduced, and thus meets the compact-size and low-profile requirements.

According to the present invention, the control chip is installed at a predetermined position on the substrate, and will not interfere the airflow by the impeller, thus introducing no noises or vibrations.

According to the present invention, the substrate may have at least an air vent pre-installed or penetrating therethrough after the encapsulant is formed. Therefore, the heat generated by the electronic component can be dissipated by airflow under the substrate of the semiconductor package.

According to the present invention, since the impeller and the electronic component can be disposed on opposing surfaces, respectively, there is no need to consider whether the axial tube will be exposed in a packaging process. Therefore, the packaging process can be performed simply and easily.

BRIEF DESCRIPTION OF DRAWINGS

The invention can be more fully understood by reading the following detailed description of the preferred embodiments, with reference made to the accompanying drawings, wherein.

DETAILED DESCRIPTION OF THE INVENTION

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

A method of fabricating a semiconductor package of a first embodiment according to the present invention is described as follows.

In a method of fabricating a semiconductor package according to the present invention, a substrate is provided that comprises a stator set formed by circuits, a top surface, a bottom surface opposing the top surface, and a via communicating the top surface with the bottom surface, an axial tube is installed in the via, and an encapsulant encapsulates the electronic component and the axial tube.

There is no limit on the sequence of installing the electronic component and the axial tube.

FIGS. 2A to 2F are cross-sectional diagrams illustrating a method of fabricating a semiconductor package of a first embodiment according to the present invention.

Figure 1A:
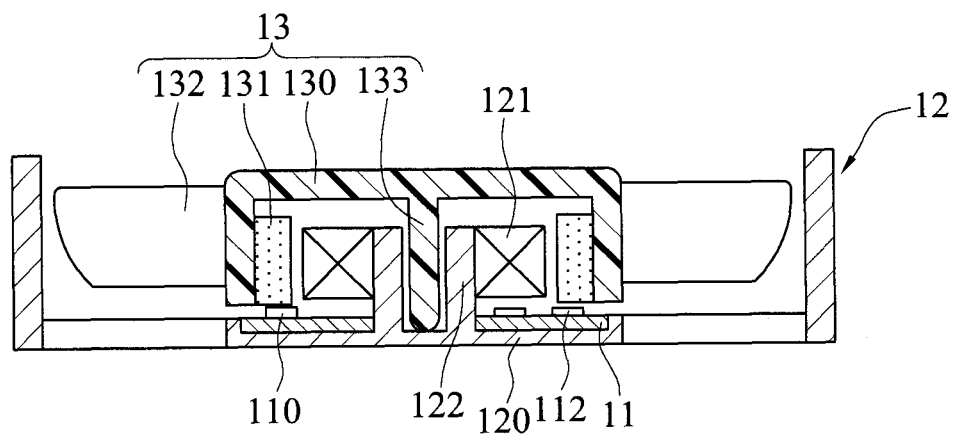
FIG. 1A is a cross-sectional diagram of a heat-dissipating fan according to the prior art.
Figure 1B:
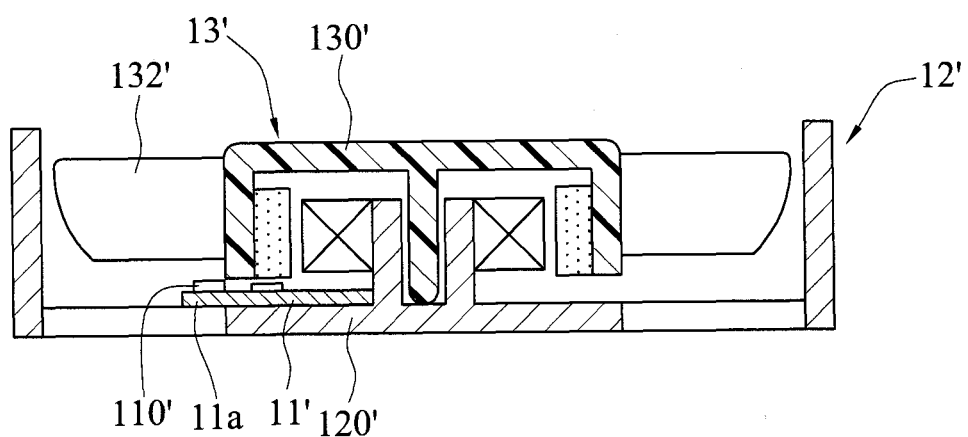
FIG. 1B is a cross-sectional diagram of a heat-dissipating fan disclosed by U.S. Pat. No. 7,345,884.
Figure 2A:
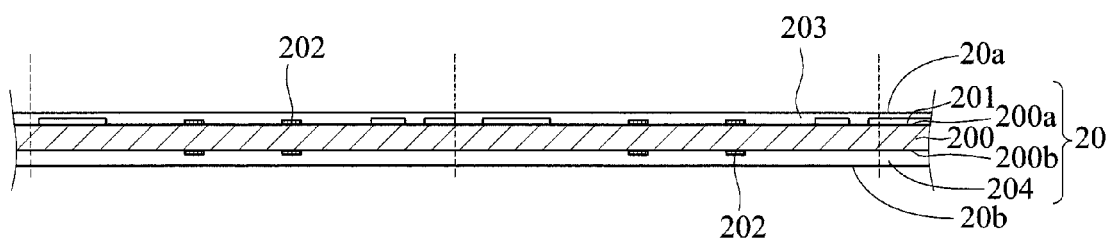
FIGS. 2A to 2F are cross-sectional diagrams illustrating a method of fabricating a semiconductor package of a first embodiment according to the present invention, wherein FIG. 2B' is a partial top view of a first surface and a partial bottom view of a second surface of a substrate shown in FIG. 2B, FIG. 2D' is a cross-sectional diagram of a semiconductor package having an outer cover, FIG. 2E' is another embodiment of FIG. 2E, and FIG. 2E" is a top view of FIG. 2E'.

As shown in FIG. 2A, a substrate 20 having a circuit layer 201 and a stator set 202 is provided. In an embodiment, the substrate 20 is fabricated by providing a core layer 200 having a first surface 200a and a second surface 200b opposing the first surface 200a, forming a spiral circuits that act as the stator set 202 on the first surface 200a and the second surface 200b of the core layer 200, and forming a circuit layer 201 on the first surface 200a in which the circuit layer 201 and the stator set 202 can be formed by patterning process.

In an embodiment, the circuit layer 201 and the stator set 202 are formed at the same time. In another embodiment, the circuit layer 201 and the stator set 202 are formed sequentially. Then, a first solder-resistant layer 203 and a second solder-resistant layer 204 are formed on the first surface 200a and the second surface 200b of the core layer 200, respectively, to cover the circuit layer 201 and the stator set 202.

Figure 2B:
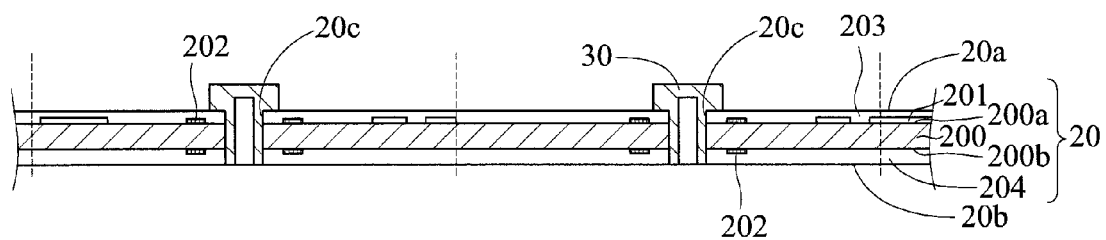
Figure 2B:
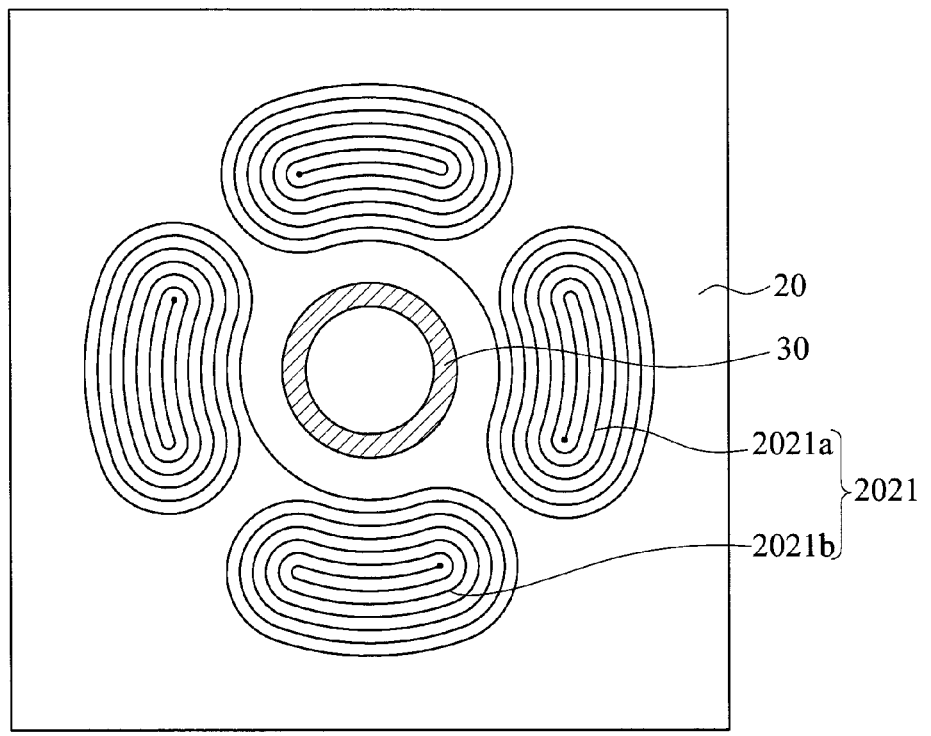
Figure 2B:
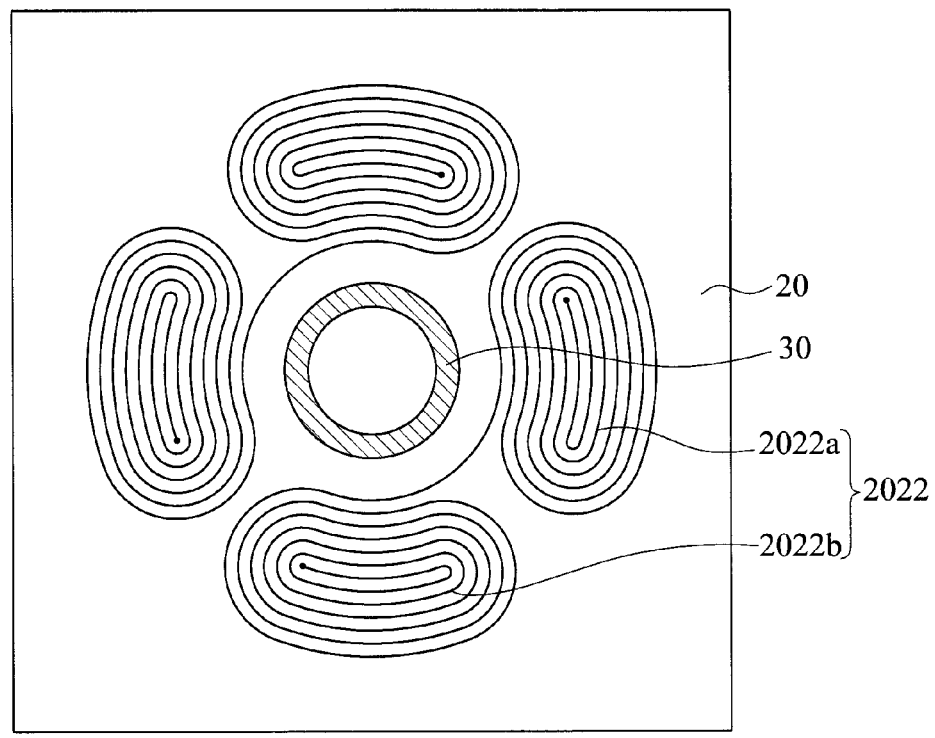

In an embodiment, As shown in the cross-sectional diagram of FIG. 2B and the top view of FIG. 2B', a via 20c is formed to communicate the top surface 20a with the bottom surface 20b of the substrate 20, and an axial tube 30 is installed in the via 20c. In an embodiment, the via 20c is axially disposed at a center of the package unit or at a region away from the center (not shown). If the via 20c is disposed at the region away from the center of the package unit, there is more area left on the top surface 20a of the substrate 20 for more electronic components (e.g., functional chips) to be disposed thereon.

In an embodiment, the axial tube 30 protrudes from the top surface 20a of the substrate 20, and the via 20c that is used for the axial tube 30 to be installed therein has an end disposed on the top surface 20a of the substrate 20 that is covered by the axial tube 30.

As shown in FIG. 2B', the axial tube 30 is installed in the center of the stator set 202, and the stator set 202 surrounds an outer side of the axial tube 30. The stator set 202 comprises a pair of first spiral circuits 2021 and a pair of second spiral circuits 2022 directly disposed on the first surface 200a and the second surface 200b of the core layer 200, respectively. Two adjacent spiral circuits, after being provided with electricity, have magnetic fields of different polarities, while two opposing spiral circuits, after being provided with electricity, have magnetic fields of the same polarity. In FIG. 2B', the upper diagram is a partial top view of the first surface of the substrate shown in FIG. 2B, while the lower diagram is a partial bottom view of the second surface of the substrate. Take FIG. 2B' as an example. The two adjacent first spiral circuits 2021a and first spiral circuits 2021b have magnetic fields of different polarities.

In an embodiment, the method according to the present invention disposes an electronic component 21 on the top surface 20a or the bottom surface 20b of the substrate 20, and forms the encapsulant 22 to encapsulate the electronic component 21.

Figure 2C:
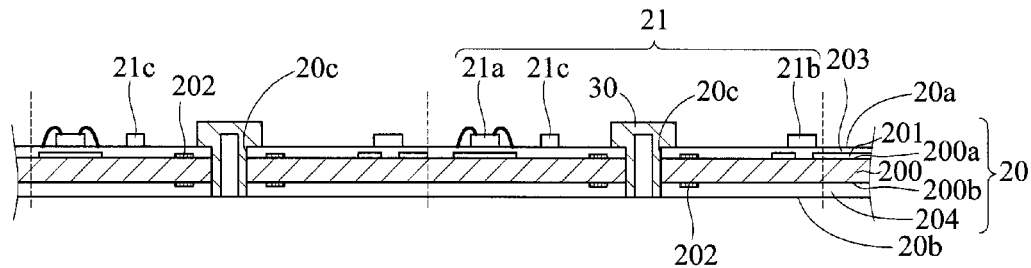

In an embodiment, shown in FIG. 2C, a plurality of electronic components 21 is mounted on the top surface of the substrate 20 and electrically connected to the top surface 20a of the substrate 20 (a surface of the first solder-resistant layer 203). The electronic component 21 comprises at least one control chip 21a and a passive component 21b. The control chip 21a conveys control signals to the stator set 202 in the substrate 20, to drive the rotation of an impeller to be installed subsequently. The electronic component 21 disposed on the top surface 20a of the substrate 20 further comprises a functional chip 21c, such as a graphic chip or a display chip.

Figure 2D:
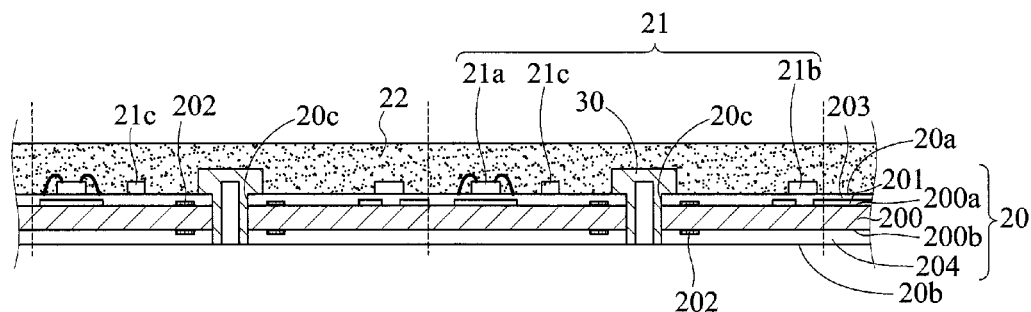
Figure 2D:
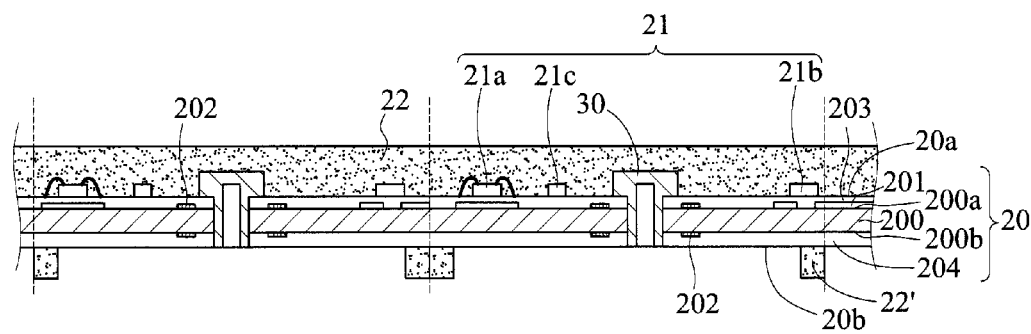

As shown in FIG. 2D, an encapsulant 22 is formed on the top surface 20a of the substrate 20 to encapsulate the electronic component 21 and a portion of the axial tube 30 that protrudes from the top surface 20a of the substrate 20.

As shown in FIG. 2D', the method further comprises, prior to cutting the substrate 20, disposing on the substrate 20 an outer cover 22' that surrounds the impeller 31 to be installed subsequently, so as to form a radial flow inducing cover. In an embodiment, the outer cover 22' can also be formed by an encapsulant, to simplify the fabrication process.

Figure 2E:
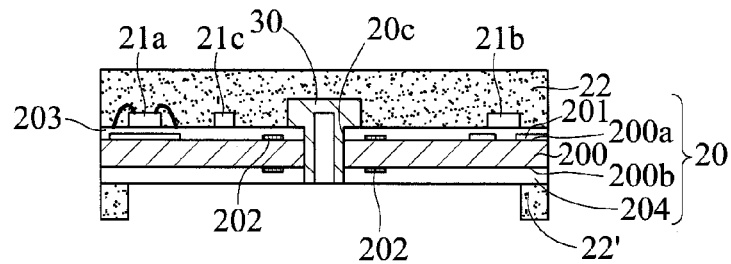
Figure 2E:
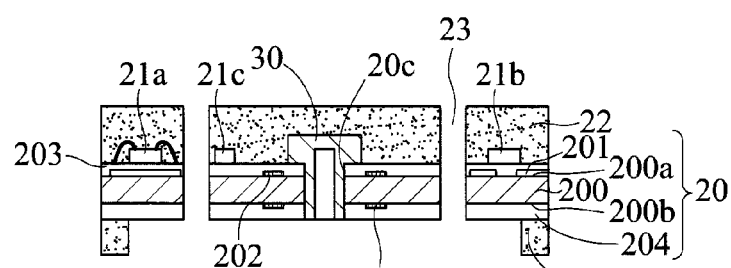

Referring to FIG. 2E, the encapsulant 22 and the substrate 20 are cut along a cutting line shown by a dashed line in FIGS. 2A to 2D. As shown in FIGS. 2E' and 2E", at least an air vent 23 is formed prior to cutting the substrate 20. The air vent 23 penetrates the top surface 20a and the bottom surface 20b of the substrate 20 and the encapsulant 22, to form an axially air passage.

Figure 2F:
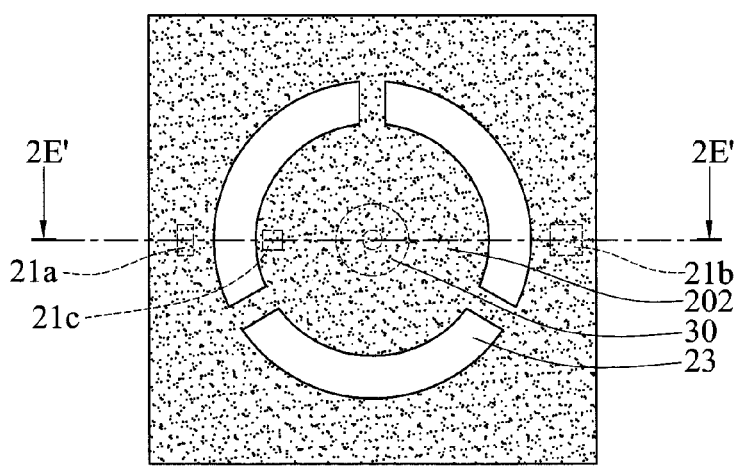
Figure 2F:
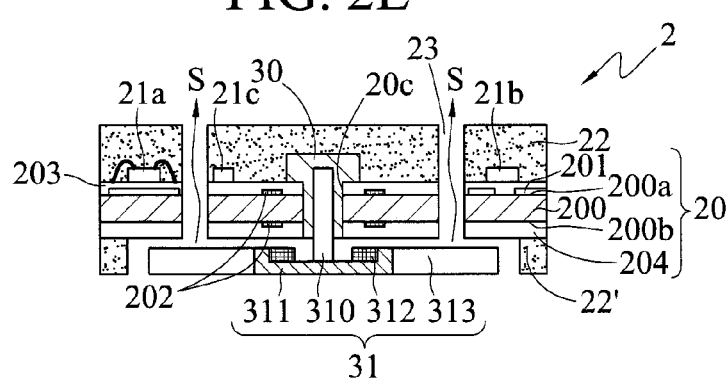

As shown in FIG. 2F, an impeller 31 is axially coupled from the bottom surface 20b of the substrate 20 to the axial tube 30, to obtain a semiconductor package 2. In an embodiment, the impeller 31 comprises a hub 311, a plate magnet 312 installed on an inner side of the hub 311, a plurality of blades 313 installed on an outer side of the hub 311, and a shaft 310 axially coupled to the hub 311. Since the stator set 202 of the semiconductor package 2 according to the present invention is formed by circuits on the second surface 200b of the core layer 200 in the substrate 20, the overall thickness of the semiconductor package 2 is reduced significantly.

When the air vent 23 is formed and the semiconductor package is in operation, airflow S provides air and conveys the heat away from the semiconductor package, to enhance the heat-dissipating efficacy.

Figure 3:
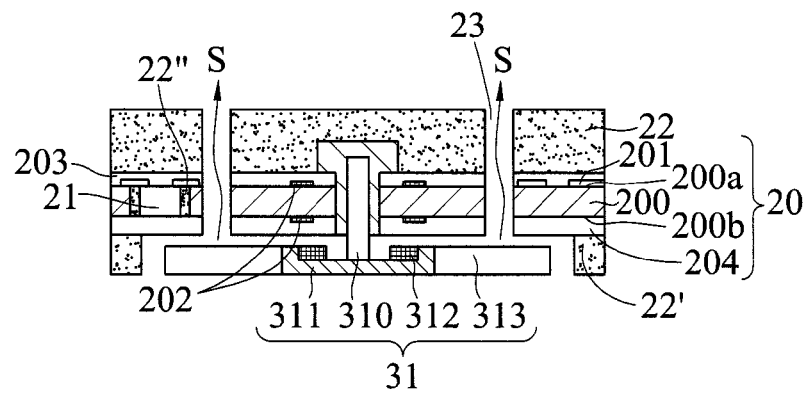
FIG. 3 is a cross-sectional diagram of a semiconductor package of a second embodiment according to the present invention.

In a second embodiment, an electronic component 21 is imbedded in the core layer 200 of the substrate 20. As shown in FIG. 3, the sides of the electronic component 21 can be filled with an adhesive, and the electronic component 21 can be electrically connected to the circuit layer 201. In an embodiment, since the electronic component 21 is embedded in the core layer 200 of the substrate 20, the overall height of the semiconductor package is further reduced.

In a third embodiment, a semiconductor package further has an externally-connected component stacked.

Figure 4:
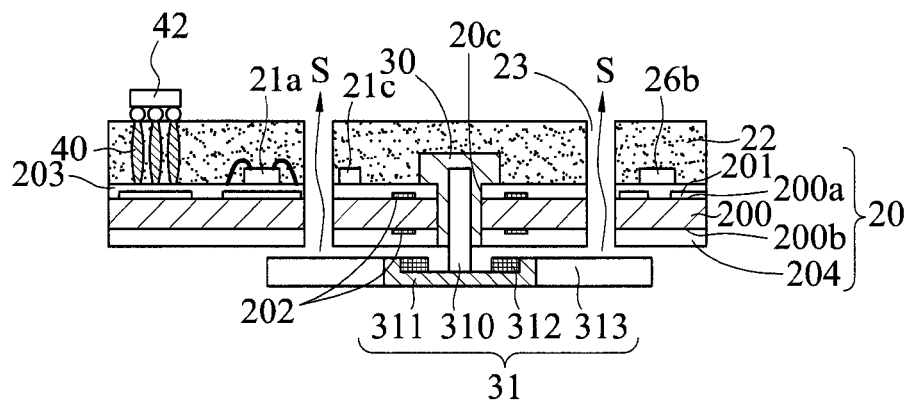
FIG. 4 is a cross-sectional diagram of a semiconductor package of a third embodiment according to the present invention, wherein FIG. 4' is another embodiment of FIG. 4.
Figure 4:
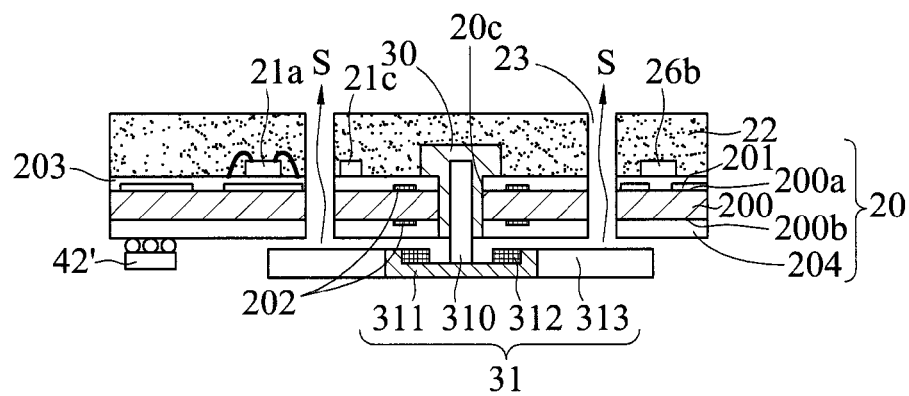

In an embodiment shown in FIG. 4, the circuit layer 201 of the substrate 20 is formed on the first surface 200a of the core layer 200, and the method of fabricating the semiconductor package further comprises, prior to forming the encapsulant 22, forming on the first solder-resistant layer 203 a conductive element 40, such as a solder ball or a metal pillar, electrically connected to the circuit layer 201 of the substrate 20 and having an end exposed from the encapsulant 22, for another externally-connected component 42 to be disposed thereon and electrically connected thereto. In an embodiment, the externally-connected component 42 is a packaged unit or a semiconductor chip. In another embodiment, the substrate 20 of the semiconductor package has a top surface 20a and a bottom surface 20b opposing the top surface 20a, and the externally-connected component 42' can be disposed on the bottom surface 20b of the substrate 20, as shown in FIG. 4'. According to the previously described method, a semiconductor package 2 according to the present invention comprises a substrate 20 having a top surface 20a, a bottom surface 20b opposing the top surface 20a, and a via 20c communicating the top surface 20a with the bottom surface 20b. In an embodiment, a stator set 202 formed by spiral circuits is disposed in the substrate 20, an axial tube 30 is axially installed in the via 20c of the substrate 20, a plurality of electronic components 21 is electrically connected to the substrate 20, an encapsulant 22 is formed on the top surface of the substrate 20 for encapsulating the electronic components 21 and the axial tube 30, and an impeller 31 is axially coupled to the axial tube 30.

In the previously described semiconductor package 2, the via 20c is disposed on a center or at a region away from the center (not shown). When the via 20c is disposed at the region away from the center, the top surface 20a of the substrate 20 has more area left for the electronic component 21 to be disposed thereon.

According to the previously described method, in the semiconductor package 2 according to the present invention the substrate 20 comprises a core layer 200 having a first surface 200a and a second surface 200b opposing the first surface 200a, a first solder-resistant layer 203 formed on the first surface 200a and having a surface corresponding to the top surface 20a of the substrate 20, and a second solder-resistant layer 204 formed on the second surface 200b and having a surface corresponding to the bottom surface 20b of the substrate 20. In an embodiment, the stator set 202 is formed by spiral circuits on the first surface 200a and the second surface 200b of the core layer 200, and is covered by the first solder-resistant layer 203 and the second solder-resistant layer 204.

In the previously described semiconductor package 2, the electronic component 21 is disposed in the substrate 20 or the top surface 20a of the substrate 20 and encapsulated by the encapsulant 22, and the substrate 20 further comprises a circuit layer 201. The previously described semiconductor package 2 further comprises a conductive element 40 disposed in the encapsulant 22 and electrically connected to the circuit layer 201 of the substrate 20, and the conductive element 40 has an end exposed from the encapsulant 22 for the externally-connected component 42 to be disposed thereon and electrically connected thereto. In an embodiment, the externally-connected component 42 comprises a packaged unit or a semiconductor chip.

The previously described semiconductor package 2 further comprises at least an air vent 23 penetrating the top surface 20a and the bottom surface 20b of the substrate and the encapsulant 22, to form an axially air passage.

The previously described semiconductor package 2 further comprises an outer cover 22' formed on the substrate 20 and surrounding an impeller 31 to be installed sequentially. In an embodiment, the outer cover 22' can be formed by an encapsulant, so as to simplify the fabrication process.

In a fourth embodiment, a semiconductor package has airflow enhanced.

Figure 5A:
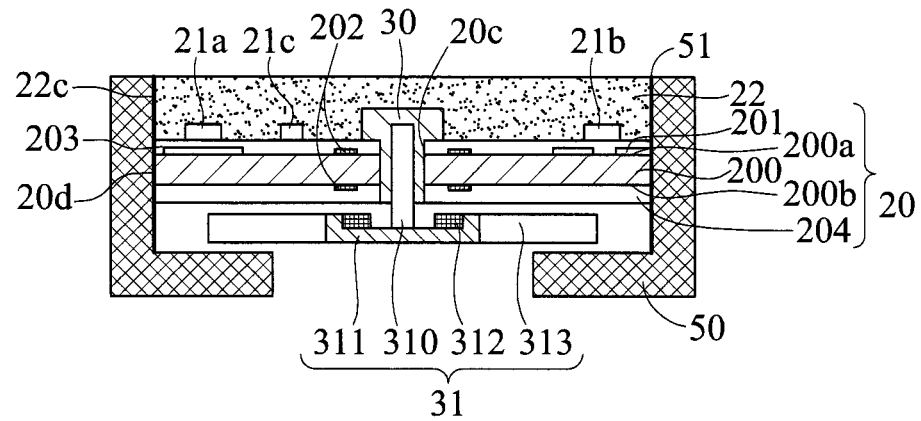
FIGS. 5A to 5B' are cross-sectional diagrams of a semiconductor package of a fourth embodiment according to the present invention, wherein FIG. 5A' shows an inducing cover that is fixed by a locking method, and FIG. 5B' is a cross-sectional view along a cutting line 5B'-5B' shown on FIG. 5B.
Figure 5A:
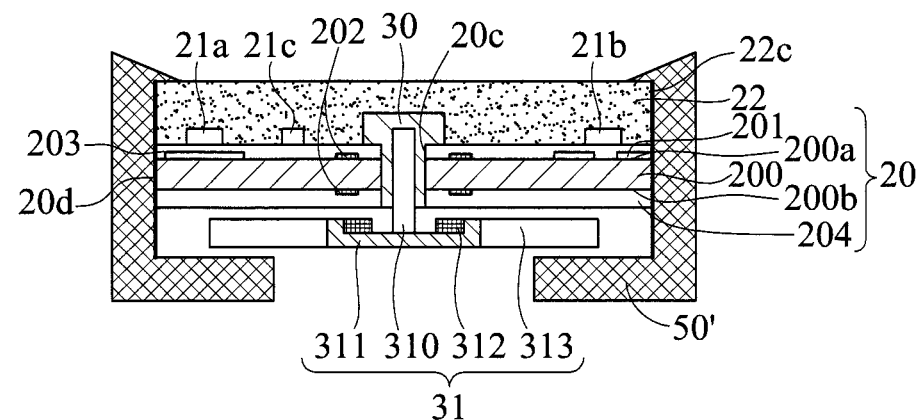
Figure 5B:
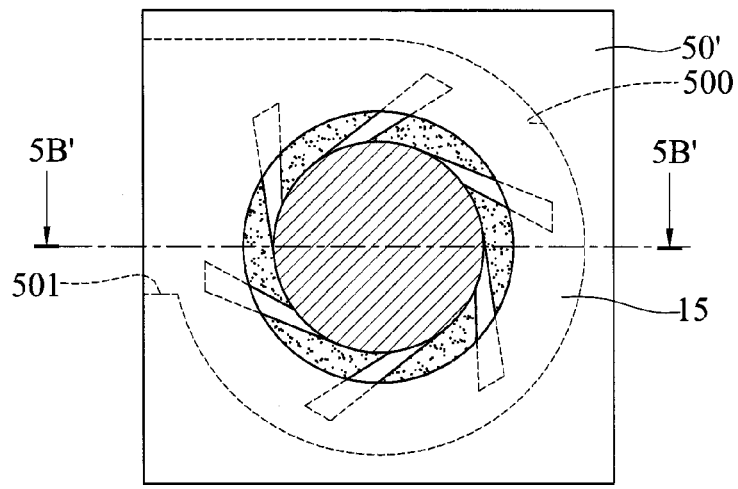
Figure 5B:
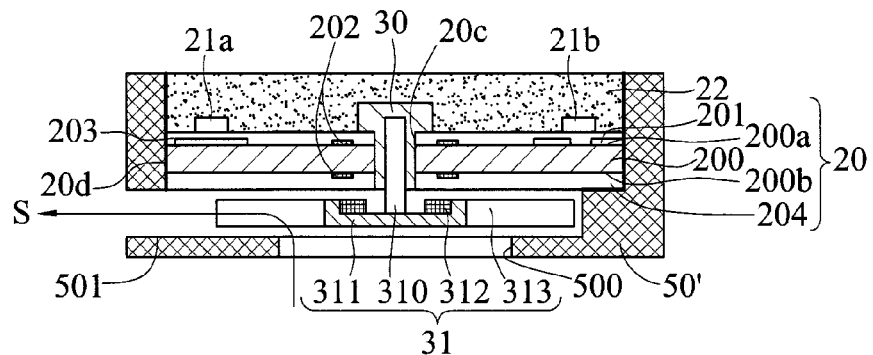

FIGS. 5A and 5B' illustrate a method of fabricating a semiconductor package having airflow enhanced according to the present invention. The method can also be applied to the second and third embodiments.

As shown in FIG. 5A, which follows a process after a cutting process shown in FIG. 2E, an adhesive 51 is employed to fix the inducing cover 50 to a side 22c of the encapsulant 22 and a side surface 20d of the substrate 20, to induce airflow to flow in an axial direction of the impeller 31. Of course, the inducing cover 50' can be fixed mechanically (as shown in FIG. 5A').

As shown in a bottom view of FIG. 5B and a cross-sectional view of FIG. 5B', the inducing cover 50' can be designed to have a first inducing opening 500 parallel to an axial direction of the axial tube 30 and a second inducing opening 501 perpendicular to the axial direction of the axial tube 30. In particular, when a semiconductor package does not have an air vent described in the previous embodiments, the inducing cover 50' shown in FIGS. 5B and 5B' can provide an upper radial airflow S.

Figure 6:
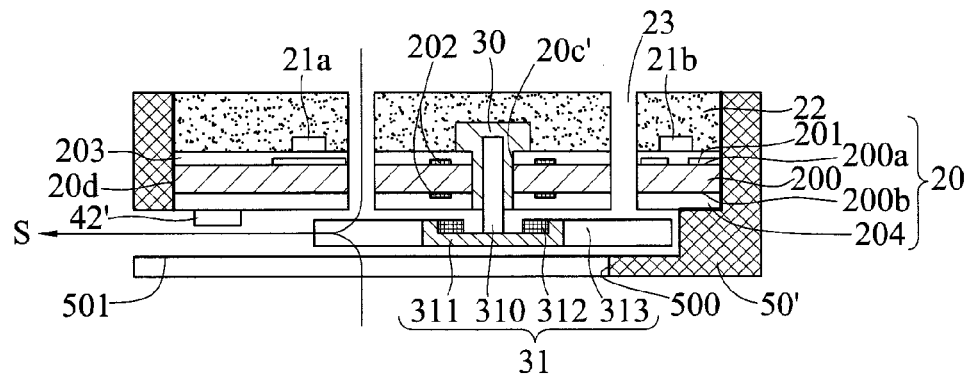
FIG. 6 is a cross-sectional diagram of a semiconductor package of a fifth embodiment according to the present invention.

In a fifth embodiment shown in FIG. 6, the air vent 23 is provided, and the via 20c' is disposed away from a center of the substrate 20. Before the encapsulant 22 and the substrate 20 being cut, an externally-connected component 42' is disposed on and electrically connected to the second surface 20b of the substrate 20. Preferably, the semiconductor package is further provided with an inducing cover 50' having radial airflow S as shown in FIGS. 5B and 5B'.

In the semiconductor package according to the present invention, since the stator set is formed in a spiral form and is directly formed on the core layer in the substrate, the overall thickness of the semiconductor package is reduced significantly. According to the present invention, the electronic component does not need to be disposed between the base of the housing and the hub of the impeller. Therefore, the heat generated by the electronic component can be dissipated effectively, the thickness of the encapsulant can be controlled, the overall thickness of the package after the impeller is carried thereby is reduced, and the electronic product can meet the compact-size and low-profile requirements. According to the present invention, the control chip is disposed at a predetermined position on the substrate, and will not interfere the airflow generated by the impeller in operation. Therefore, the present invention will not suffer from the noise or vibration problem.

According to the present invention, at least an air vent is pre-installed on the substrate or penetrates the substrate after the encapsulant is formed. Therefore, the heat generated by the electronic component can be dissipated via an airflow channel under the substrate of the semiconductor package. Since the impeller and the electronic component are disposed on two opposing surfaces, respectively, the exposure problem of the axial tube during a packaging process is solved, and the packaging process can be performed easily.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A semiconductor package, comprising:
  a substrate having a top surface, a bottom surface opposing the top surface, a via communicating the top surface with the bottom surface, a circuit layer formed in the substrate, and a stator set formed by circuits;
  an axial tube axially installed in the via of the substrate and having an opening, wherein the opening is exposed from the bottom surface of the substrate, and the opening is free from extending through the axial tube;
  a plurality of electronic components mounted on the top surface of the substrate and electrically connected to the substrate;
  an encapsulant formed on the top surface of the substrate for encapsulating the electronic components and the axial tube; and an impeller axially coupled to the axial tube via the bottom surface of the substrate, wherein the impeller comprises a plurality of blades disposed on the bottom surface of the substrate.

2. The semiconductor package of claim 1, wherein the substrate comprises a core layer having a first surface and a second surface opposing the first surface, a first solder-resistant layer formed on the first surface and an exposed surface thereof corresponding to the top surface, and a second solder-resistant layer formed on the second surface and an exposed surface thereof corresponding to the bottom surface, wherein the stator set is formed on the first surface and the second surface of the core layer and is covered by the first solder-resistant layer and the second solder-resistant layer.

3. The semiconductor package of claim 2, wherein the stator set comprises a first spiral circuit formed on the first surface of the core layer and covered by the first solder-resistant layer, a second spiral circuit formed on the second surface of the core layer and covered by the second solder-resistant layer, and at least a conductive via penetrating the core layer of the substrate for electrically connecting the first spiral circuit to the second spiral circuit.

4. The semiconductor package of claim 1, further comprising a conductive element disposed in the encapsulant and electrically connected to the circuit layer of the substrate and having an end exposed from the encapsulant.

5. The semiconductor package of claim 1, wherein the via is formed at a region away from a center of the semiconductor package.

6. The semiconductor package of claim 1, further comprising at least an air vent penetrating the top surface and the bottom surface of the substrate and the encapsulant to form an axial air passage.

7. The semiconductor package of claim 1, further comprising an outer cover disposed on the substrate and surrounding the impeller.

8. The semiconductor package of claim 1, wherein the electronic components at least comprise a control chip and a passive component.

9. The semiconductor package of claim 1, further comprising an inducing cover fixed to the encapsulant and a side surface of the substrate.

10. The semiconductor package of claim 9, wherein the inducing cover is mechanically or adhesively fixed to the encapsulant and the side surface of the substrate.

11. The semiconductor package of claim 9, wherein the inducing cover is directly formed on the substrate by the encapsulant.

* * * * *